(12) United States Patent
Ohmura et al.

(10) Patent No.: US 6,586,823 B2
(45) Date of Patent: Jul. 1, 2003

(54) SEMICONDUCTOR DEVICE THAT CAN HAVE A DEFECTIVE BIT FOUND DURING OR AFTER PACKAGING PROCESS REPAIRED

(75) Inventors: Ryuji Ohmura, Hyogo (JP); Kazushi Sugiura, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/127,759

(22) Filed: Apr. 23, 2002

(65) Prior Publication Data

US 2003/0030135 A1 Feb. 13, 2003

(30) Foreign Application Priority Data

Aug. 9, 2001 (JP) ........................ 2001-241539

(51) Int. Cl.⁷ .................... H01L 23/02; G11C 29/00
(52) U.S. Cl. .................. 257/678; 365/200; 365/201; 365/222
(58) Field of Search ................. 257/723, 724, 257/48, 681, 678; 365/200, 201, 222; 714/718

(56) References Cited

U.S. PATENT DOCUMENTS 6,438,045 B1 * 8/2002 King et al. ............ 365/200
2003/0016570 A1 * 1/2003 Nakahara et al. ........ 365/200

OTHER PUBLICATIONS

T. Takahashi et al., Nikkei Microdevices, Mar. 2001, pp. 141–147.

* cited by examiner

Primary Examiner—Long Pham
Assistant Examiner—Aneta Cieslewicz
(74) Attorney, Agent, or Firm—McDermott, Will & Emery

(57) ABSTRACT

A replacement information storage unit stores additional replacement information determined according to testing carried out during or after assembly. A replacement information addition load unit receives additional replacement information from outside a plurality of memory chips. A replacement data retain unit stores address information corresponding to a defective memory cell found during a fabrication process of a memory chip, and can alter the output address signal according to externally applied additional replacement information.

13 Claims, 17 Drawing Sheets

SEMICONDUCTOR DEVICE THAT CAN HAVE A DEFECTIVE BIT FOUND DURING OR AFTER PACKAGING PROCESS REPAIRED

BACKGROUND OF THE INVENTION

1. Field of the Invention

The present invention relates to a configuration of a semiconductor device having a plurality of semiconductor integrated circuit chips of various types assembled in one package.

2. Description of the Background Art

In accordance with down-sizing of apparatus in which a semiconductor integrated circuit chip is mounted such as in cellular phones, the so-called three-dimensional packaging technology of mounting a plurality of semiconductor integrated circuit chips in a package and sealing the package has been developed. The usage of such 3-dimensional packaging technology allows a memory of larger capacity and a multifunction system of a higher level to be sealed in a package that has a profile identical to that of an existing product. There was an advantage that the apparatus can be fabricated using currently-available packaging apparatuses with the functions of the apparatus being improved.

In the application to a cellular phone, for example, the technique of sealing the multilayers of a flash memory chip for program storage and a static type random access memory (referred to as SRAM hereinafter) chip for data backup within one package has been realized. By using such 3-dimensional packaging technique, it is possible to realise a system that stacks a microcomputer chip and a dynamic random access memory (referred to as DRAM hereinafter) chip to be mounted in one package.

This three-dimensional packaging technique contributes, not only to down-sizing of the apparatus, but also to increase the speed of computers and communication apparatuses. This is because signals can be transmitted at high speed by mounting and wiring chips in a 3-dimensional manner to reduce the wiring length.

FIG. 17 shows the concept of the process of stacking two semiconductor memory chips 9010 and 9030 within one package as an example of the above-described 3-dimensional packaging.

It is assumed that the first semiconductor memory chip 9010 is, for example, a flash memory, whereas the second semiconductor memory chip 9030 is an SRAM.

Semiconductor memory chip 9010 includes a memory cell array 9022 with a plurality of spare memory cells in addition to a plurality of proper memory cells, a control circuit 9016 receiving a signal from an input terminal group 9012 that receives an externally applied control signal and address signal to control the operation of semiconductor memory chip 9010, a row select circuit 9018 selecting a row in memory cell array 9022 under control of control circuit 9016, a column select circuit 9020 selecting a column to read and write data, a data input/output circuit 9024 receiving and providing to column select circuit 9022 the data applied from data input/output terminal 9014, or receiving and providing to a data input/output terminal 9014 data read out from column select circuit 9020, and a replacement data retain circuit 9026 prestoring a defective address where a defective memory cell found in memory cell array 9022 in a test mode is located, and selecting a spare memory cell instead of a defective proper memory cell when an address signal selecting the defective memory cell is applied from an external source.

Semiconductor memory chip 9030 has a structure basically similar to that of the above-described semiconductor memory chip 9010. In FIG. 17, only a replacement data retain circuit 9032 storing a defective address to replace a defective memory cell with a proper memory cell in semiconductor memory chip 9030 is depicted. Other structural components are not illustrated.

As shown in FIG. 17, in a multichip module storing a plurality of semiconductor memory chips 9010 and 9030 in one package, each semiconductor memory chip is first subjected to testing in the wafer state according to individual testing standards. In order to replace a defective memory cell with a redundant memory cell and repair the defective memory, programming of the defective address is effected in respective replacement data retain circuits 9026 and 9032 to repair defective memory cell. Then, testing is carried out again to select the semiconductor memory chip determined to include memory cells that are all good.

After sorting out the semiconductor memory chips in the wafer state, the chips are separated by dicing. A multichip module is assembled by combining the good semiconductor memory chips. In semiconductor memory chip 9010 of FIG. 17, input signal terminal 9012 and data input/output terminal 9014 are depicted at only one side of the chip for the sake of simplification. In practice, such terminals are disposed over at least one side around the chip.

Thus, with respect to a lead frame 9100 in the multichip module, semiconductor memory chip 9010 is connected by chip-wire bonding 9120. Chip 9030 stacked on chip 9010 is bonded with the pad of chip 9010 through chip wire bonding 9110.

A lead 9130 extends outward from lead frame 9100 to transfer signals or data with a source external to the package. Lead frame 9100 and chips 9010 and 9030 shown in FIG. 17 are, in practice, sealed within a package or a resin mold.

In forming a multichip model by the above process, the defective address is programmed in replacement data retain circuits 9026 and 9032 by burning out the fuse or the like through a laser trimming device during wafer testing in the defective memory cell repair process of each chip. In each chip, an address replacement function is rendered effective to perform a redundancy replacement repair.

In such a multichip module, testing is also carried after the packaging process. The package in which all the memories of various types are good is sorted out as an acceptable product.

The above description is directed to the case where two semiconductor memory chips, for example, are sealed in one package. There is also a case where more semiconductor memory chips are sealed in one package.

Consider the case where three chips, for example, are sealed in one package. Assuming that the yield in the testing after packaging is y1% for the first chip, y2% for the second chip and y3% for the third chip, the total yield after packaging is degraded to (y1×y2×y3) %.

In other words, there is a possibility of a defect being produced before the assembly process (packaging process) ends even for chips that are determined to be acceptable in a wafer state. Such chips are taken as defective products since it cannot be repaired even if detection of a defective chip is carried out in the testing subsequent to the assembly process (packaging process). There was a problem that the total yield of the final product is degraded.

SUMMARY OF THE INVENTION

An object of the present invention is to provide a semiconductor device that can have a defective bit found during or after the packaging process in a multichip module repaired to improve the total yield.

According to an aspect of the present invention, a semiconductor device includes a package, a hold member, a plurality of memory chips, a coupling member, a replacement information storage circuit, and a replacement storage control circuit.

The hold member is provided in the package. The plurality of memory chips are held by the hold member. Each memory chip includes a plurality of proper memory cells, a spare memory cell, a first storage circuit, an information replacement circuit, a replacement information input circuit, and a select circuit. The first storage circuit stores address information corresponding to a defective memory cell found during a fabrication process of a memory chip. The information replacement circuit can alter the address information output from the first storage circuit according to externally applied additional replacement information. The replacement information input circuit receives additional replacement information from outside the memory chip. The select circuit selects any of a proper memory cell and a spare memory cell according to the output from the information replacement circuit and an address signal.

The coupling member transfers a signal with a plurality of memory chips. The replacement information storage circuit is provided on the hold member to record additional replacement information determined according to testing carried out on a plurality of memory chips after at least the plurality of memory chips and the coupling member are formed on the hold member. The replacement storage control circuit is provided on the hold member to apply the additional replacement information stored in the replacement information storage circuit to the replacement information input circuit of the plurality of memory chips.

The advantage of the present invention is that the total yield can be improved since a defective bit found during or after packaging can be repaired in a multichip module.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
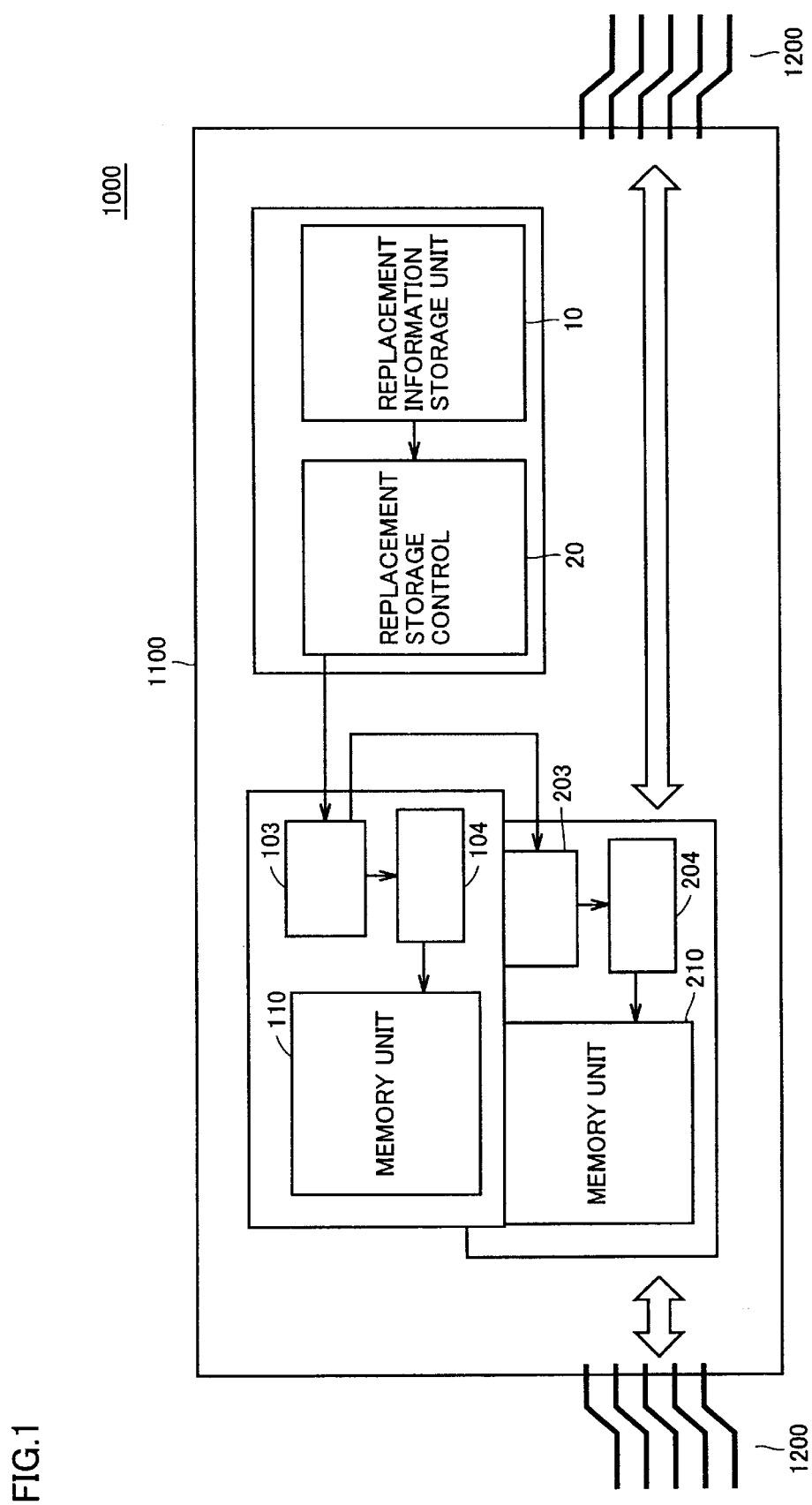
FIG. 1 is a schematic diagram of a structure of a multichip module 1000 according to a first embodiment of the present invention.

FIG. 1 is a schematic diagram of a structure of a multichip module 1000 according to a first embodiment of the present invention.

In multichip module 1000, it is assumed that a plurality of semiconductor memory chips, for example two semiconductor memory chips 100 and 200, are mounted on a lead frame 1100. Semiconductor memory chips 100 and 200 are electrically coupled to each other through chip wire bonding or a bump and the like to transfer signals and data with an external source via a lead 1200.

Multichip module 1000 further includes a replacement information storage unit 10 to store information of a defective address detected during an assembly process (packaging process), and a replacement storage control unit 20 applying the data serially to semiconductor memory chips 100 and 200 based on the information stored in replacement information storage unit 10. In other words, testing of semiconductor memory chips 100 and 200 is carried out before the final sealing step into the package and when semiconductor memory chips 100 and 200 are assembled on lead frame 1100. The information stored in replacement information storage unit 10 is determined according to this testing.

Semiconductor memory chip 100 includes a replacement information addition load unit 103 receiving replacement information applied from replacement storage control unit 20, and a replacement data retain unit 104 applying information of a defective address that is to be subjected to redundancy replacement to a memory unit 110 based on the defective address information detected during the individual testing of semiconductor memory chip 100 and the defective address information subsequent to assembly applied from replacement information addition load unit 103.

Similarly, semiconductor memory chip 200 includes a replacement information addition load unit 203 receiving replacement information applied from replacement storage control unit 20 via replacement information addition load unit 103 of semiconductor memory chip 100, and a replacement data retain unit 204 applying information of a defective address to be subjected to redundancy replacement to a memory unit 210 based on the defective address information detected in the individual testing of semiconductor memory chip 200 and the defective address information subsequent to assembly applied from replacement information addition load unit 203.

Figure 2:
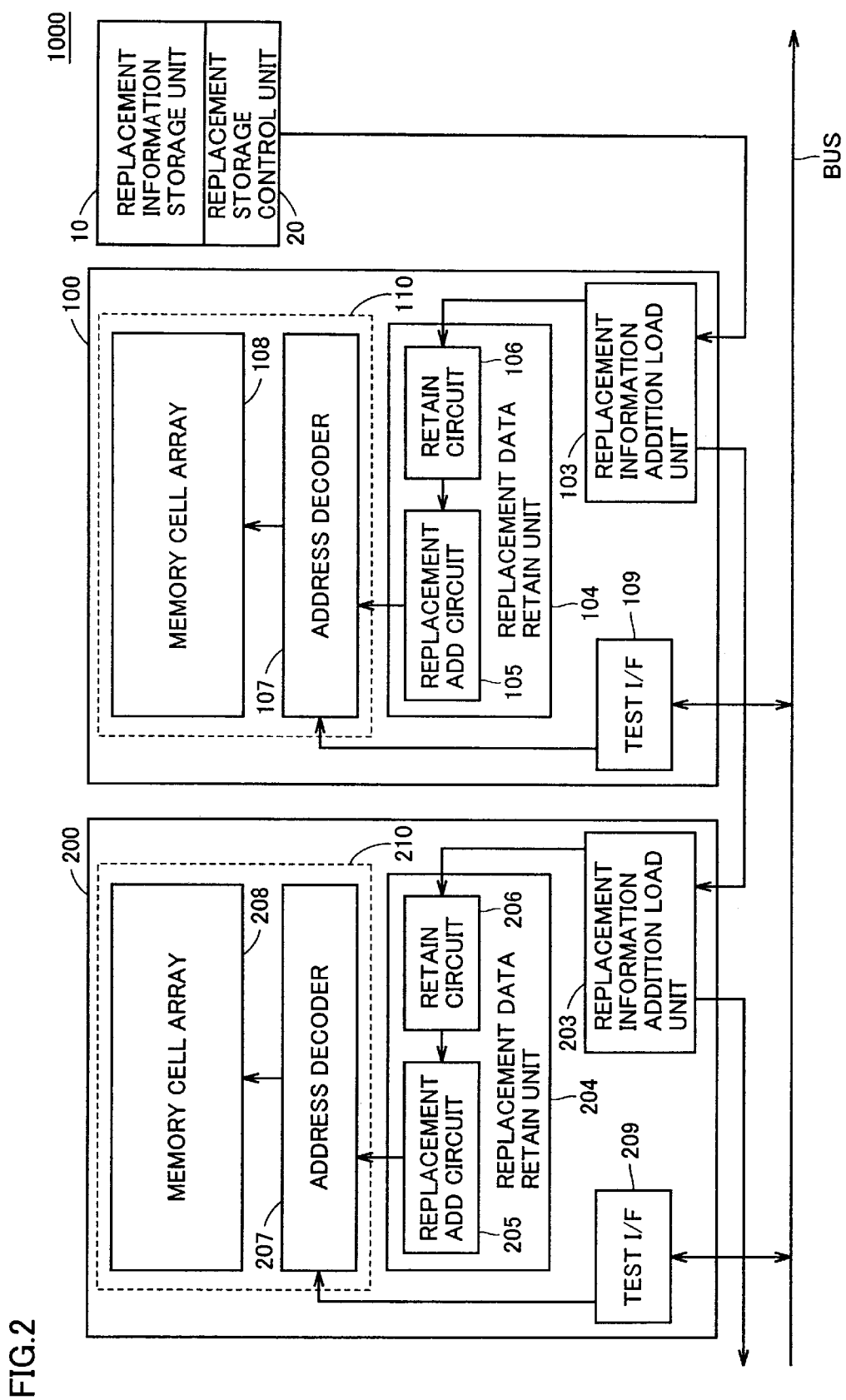
FIG. 2 is a block diagram of multichip module 1000 of FIG. 1 to describe in further detail the structure.

FIG. 2 is a block diagram to describe in further detail the structure of multichip module 1000 of FIG. 1.

Referring to FIG. 2, replacement storage control unit 20 in multichip module 1000 reads out at one time or sequentially a bit train of the replacement information that is to be added, stored in replacement information storage unit 10 according to the presence/absence of wire bonding.

Replacement information storage unit 10 stores replacement information to be added through bonding bump, flash memory, wiring fuses and the like as well as by wire bonding that will be described hereinafter.

The bit train of replacement information read out from replacement information storage unit 10 is applied serially to replacement information addition load unit 103 of semiconductor memory chip 100 from replacement storage control unit 20 in synchronization with a triggering clock signal that controls the replacement information retaining operation. The input serial data is applied to replacement data retain unit 104 in semiconductor memory chip 100 and also output as serial data to be applied to replacement information addition load unit 203 in semiconductor memory chip 200. In the case where three or more semiconductor memory chips are mounted in multichip module 1000, a bit train of replacement information is applied to the replacement information addition load unit of the next chip from replacement information addition load unit 203.

Thus, the bit train output from replacement storage control unit 20 is sequentially applied to a plurality of semiconductor memory chips. Replacement information addition load unit 103 in semiconductor memory chip 100 is formed to set the data of interest in replacement data retain unit 104 at the stage when loading of the additional replacement information has ended for all the memory chips in multichip module 1000. In other words, the bit train of replacement information is set into replacement data retain unit 104 in semiconductor memory chip 100 when loading of respective corresponding replacement information data has completely ended. The same applies for the other semiconductor memory chips.

Alternatively, a structure can be implemented in which replacement data retain unit 104 identifies and inputs the replacement information data corresponding to itself by embedding a specific bit (ID bit) indicative of replacement information to be added to semiconductor memory chip 100 in the serial data output from replacement storage control unit 20.

Replacement data retain unit 104 in semiconductor memory chip 100 includes a retain circuit 106 to retain additional replacement information from replacement information addition load unit 103, and a replacement information add circuit 105 that can alter, in response to data applied from retain circuit 106, the information of a defective address stored according to laser trimming or the like of a fuse by the testing under a wafer state carried out individually of semiconductor memory chip 100.

Memory unit 110 in semiconductor memory chip 100 includes an address decoder 107 selecting a proper memory cell or a redundant memory cell in memory cell array 108 based on an externally applied address signal and the information applied from replacement information add circuit 105, and a test interface circuit 109 to transfer a test signal with an external source during testing of an individual memory chip 100 and also in the testing during or after assembly of a multichip module.

The other semiconductor memory chip 200 has a similar structure.

Figure 3:
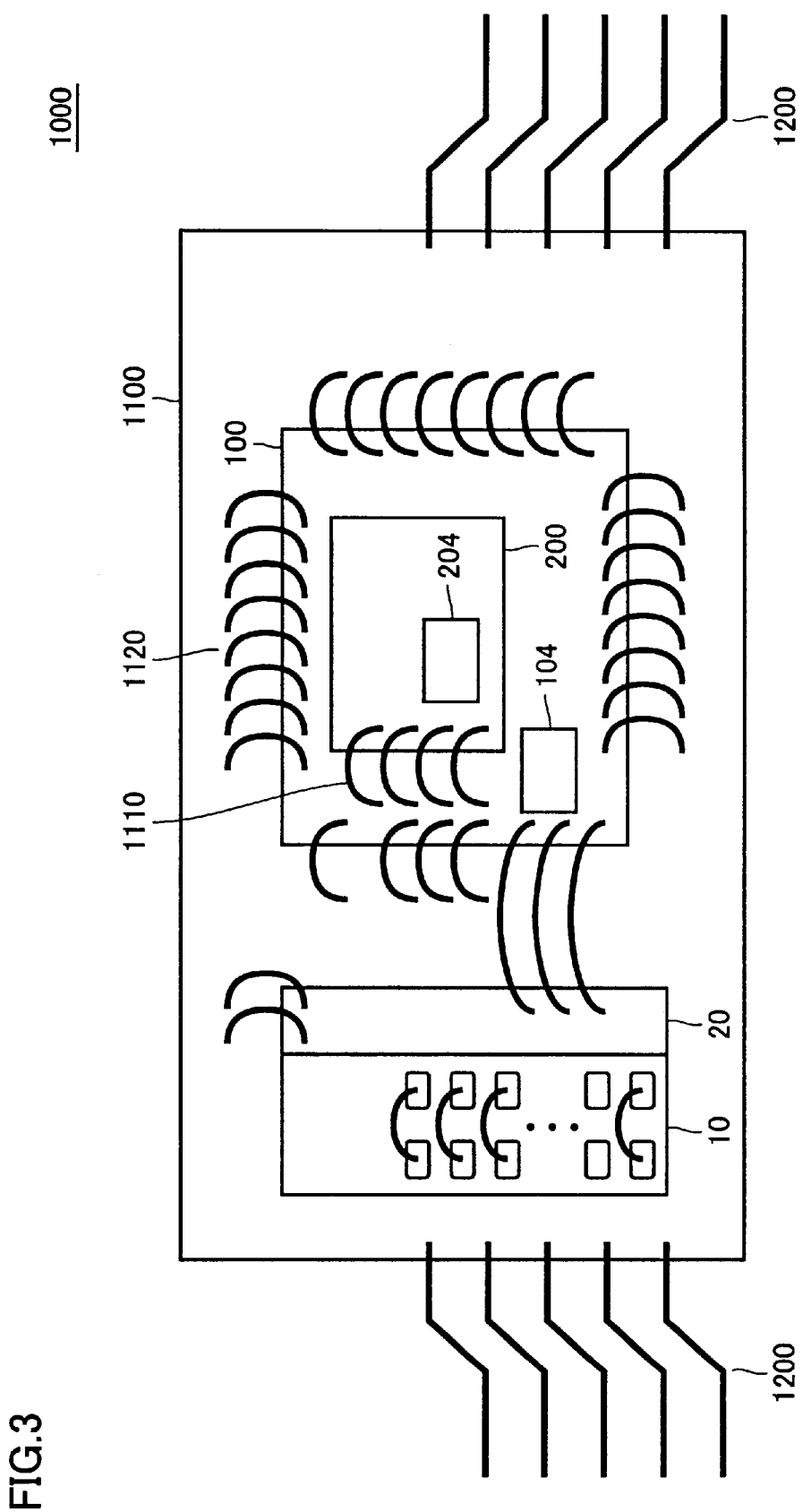
FIG. 3 shows a specific structure of multichip module 1000 of FIG. 2.
Figure 17:
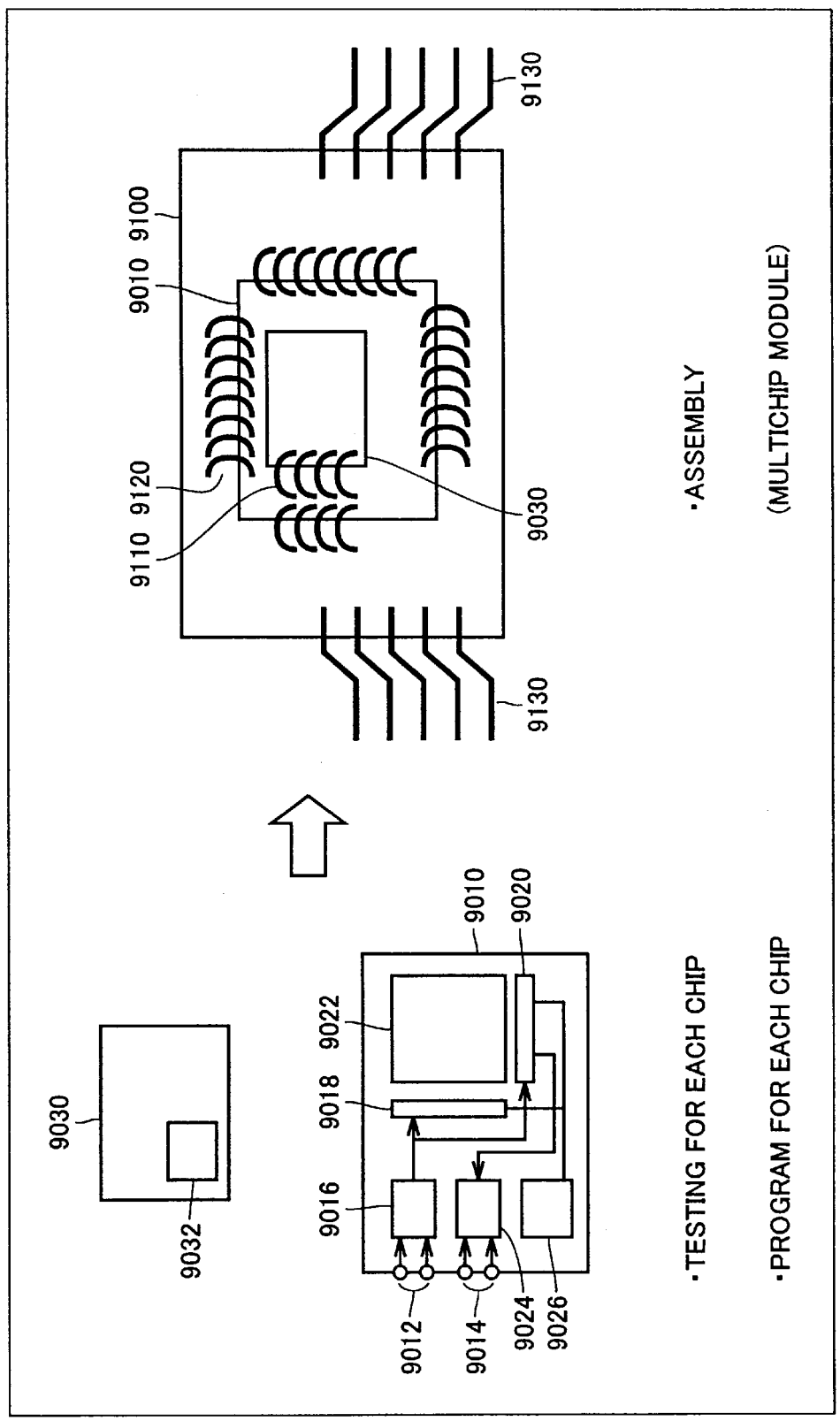
FIG. 17 is a schematic diagram of two semiconductor memory chips 9010 and 9030 to indicate the stacking process.

FIG. 3 shows a specific structure of multichip module 1000 of FIG. 2, comparable to FIG. 17 of the prior art.

In multichip module 1000, semiconductor memory chip 100 is connected by chip wire bonding 1120 to lead frame 1100. Chip 200 is stacked on chip 100 and bonded to the pad of chip 100 through chip wire bonding 1110.

A lead 1200 extends outside from lead frame 1100 to transfer signals and data with an external source. Lead frame 1100 and chips 100 and 200 are eventually sealed in a package or a resin mold.

In the first embodiment, a process for complete sealing in a package or resin mold is carried out after recording the replacement additional information through wire bonding into replacement information storage unit 10.

Replacement information storage unit 10 of multichip module 1000 shown in FIG. 3 stores replacement information for a defective address found in the testing after the assembly process (package process) according to whether the terminals across two sites are to be wire bonded or not.

Replacement storage control unit 20 is supplied with power supply potential through wire bonding or the like, and connected to memory chip 100 through the wire bonding.

Figure 4:
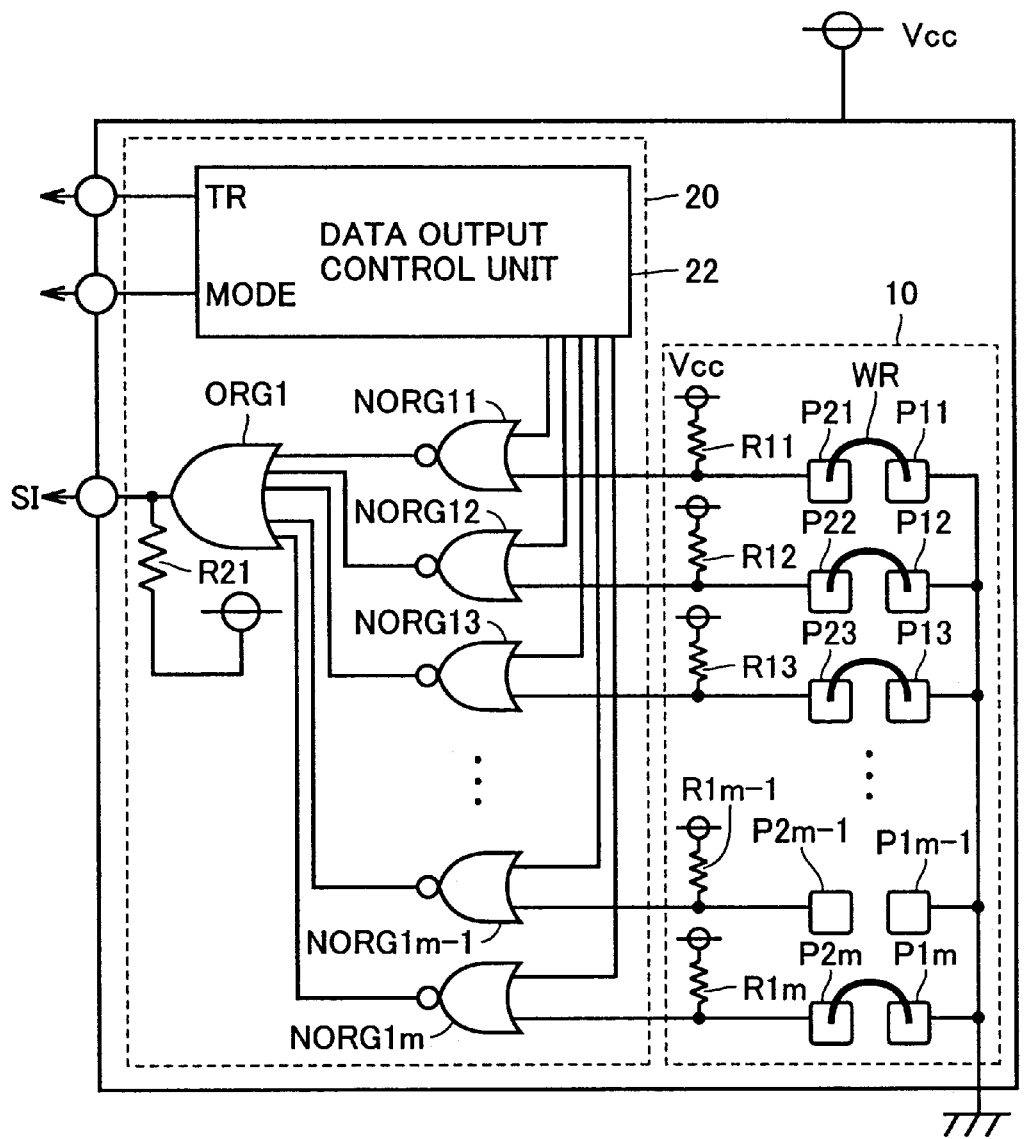
FIG. 4 is a schematic block diagram to describe a structure of a replacement information storage unit 10 and a replacement storage control unit 20.

FIG. 4 is a schematic block diagram to describe the structure of replacement information storage unit 10 and replacement storage control unit 20 shown in FIGS. 2 and 3.

Replacement information storage unit 10 includes m pads P11–P1$m$ coupled with ground potential, m pads P21–P2$m$ provided corresponding to pads P11–P1$m$, respectively, and high resistive elements R11–R1$m$ coupled between a power supply potential Vcc and respective pads P21–P2$m$. Pads P11–P1$m$ corresponding to pads P21–P2$m$ are connected through a wire WR according to the information to be stored.

Replacement information control unit 20 includes a data output control unit 22 to provide a trigger signal TR indicating the timing to output data to memory chip 100 and a signal MODE indicative of a transfer mode of replacement data, NOR circuits NORG11–NORG1$m$ receiving a timing control signal from data output control unit 22 at one input and having the other input node connected to pads P21–P2$m$, an OR circuit ORG1 receiving respective outputs of NOR circuits NORG11–NORG1$m$ to provide the same as serial data SI to memory chip 100, and a high resistive element R21 connected between an output node of OR circuit ORG1 and power supply potential Vcc.

Therefore, from replacement storage control unit 20 are output a timing signal TR from data control unit 22, a mode signal MODE to specify the operation mode, and an output SI from OR circuit ORG1 to replacement information additional load unit 103 in semiconductor chip 100.

Figure 5:
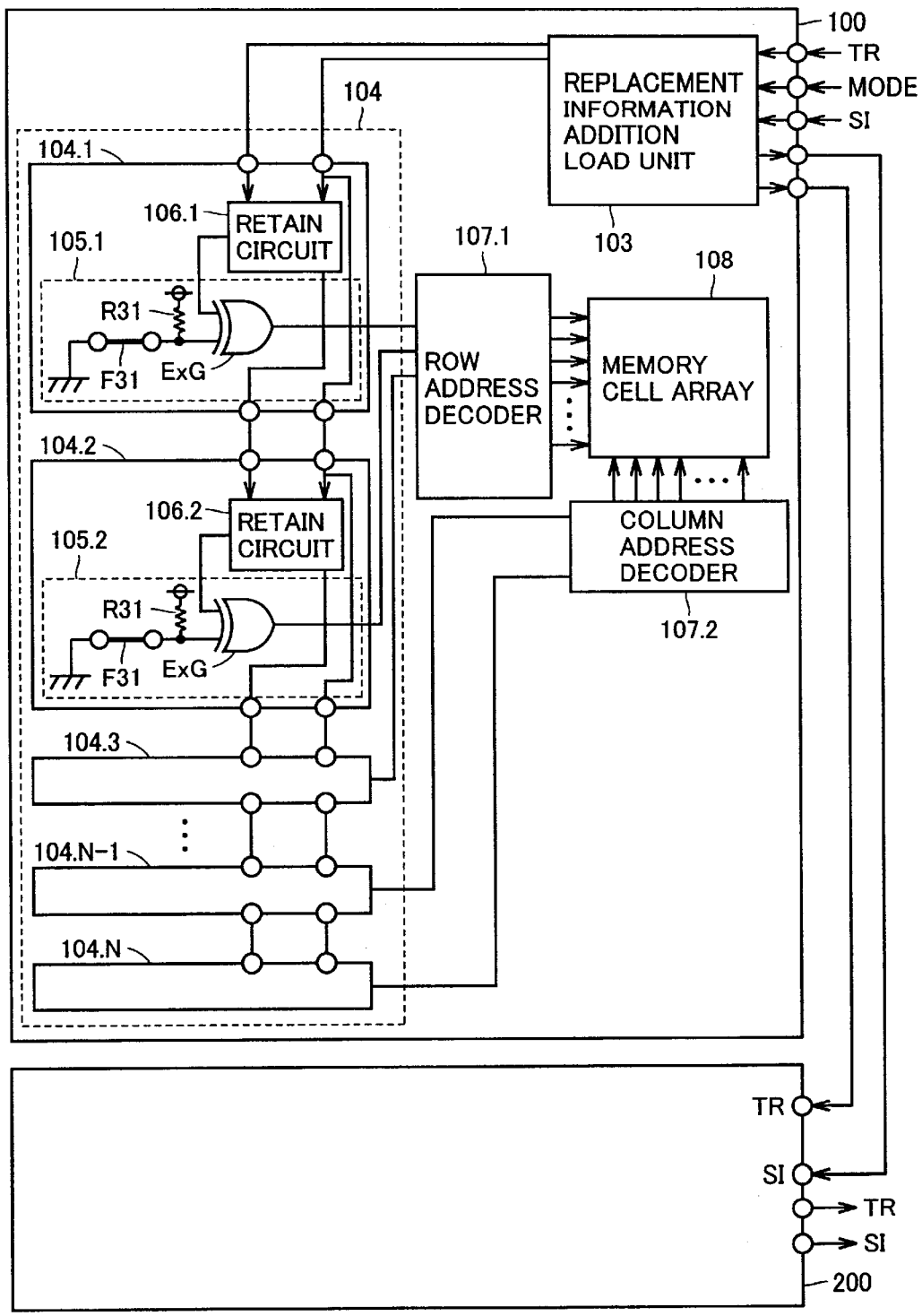
FIG. 5 is a schematic block diagram to describe a structure of a semiconductor memory chip 100.

FIG. 5 is a schematic block diagram to describe a structure of semiconductor memory chip 100.

The bit train of the replacement information to be added set in replacement information storage unit 10 is output from replacement storage control unit 20 as serial data SI to be transmitted sequentially to replacement information addition load unit 103. Replacement information addition load unit 103 in memory chip 100 outputs data serially to replacement data retain unit 104 when determination is made that the data is to be set for memory chip 100.

Replacement data retain unit 104 is provided with a plurality of sets of a high resistive element R31 and a fuse element F31 connected in series between power supply potential Vcc and ground potential to preprogram the defective address so that a memory cell row or memory cell column can be replaced with a spare memory cell row or spare memory cell column in the individual testing of a semiconductor memory chip.

Corresponding to each of the plurality of sets of high resistive element R31 and fuse element F31, replacement data retain unit 104 includes a plurality of retain circuits 106.1–106.N (N: natural number) receiving serial data SI from replacement information addition load unit 103 in response to timing signal T for output, and a plurality of exclusive OR gate circuits ExG having respective input nodes connected to the connection node between resistive element R31 and fuse element F31, and receiving the output from retain circuit 106 at respective other input nodes.

Memory cell array 108 includes a plurality of proper memory cells arranged in a matrix, and a spare memory cell row and spare memory cell column for replacement when there is a defect in the proper memory cell.

The output from exclusive OR gate circuit ExG is applied to row address decoder 107.1 or column address decoder 107.2. Row address decoder 107.1 and column address decoder 107.2 select a proper memory cell or a spare memory cell in memory cell array 108 according to the comparison result between an externally applied address signal and the output from exclusive OR gate circuit ExG.

Serial data SI from replacement information load unit 103 is sequentially transmitted serially to retain circuits 106.1–106.N provided corresponding to respective sets of resistive element R31 and fuse element F31. Trigger signal TR to set data in retain circuit 106 is applied in common to retain circuit 106 to trigger data transfer in synchronization with data SI transmitted serially.

In the case where the data detected by testing after the assembly process (packaging process) and applied to retain circuit 106 via replacement information addition load unit 103 matches the data set according to the burn out of fuse element F31, exclusive OR gate circuit ExG provides an output of an L level.

In contrast, when the data do not match, exclusive OR gate circuit ExG provides an output of an H level.

For example, it is assumed that fuse element F31 is not burned out and one input of exclusive OR gate circuit ExG is set to an L level. In this case, each output from exclusive OR gate circuit 105 attains an L level or an H level depending upon whether the output from retain circuit 106 is at an L level or an H level. Thus, the level set by fuse element F13 can be altered by the information added afterwards.

Similarly, in the case where fuse element F31 is burned out and one input node of exclusive OR gate circuit ExG is at an H level, the information set by fuse element F31 can be altered by replacement information data added afterwards.

Semiconductor memory chip serial data SI and trigger signal TR output from replacement information addition load unit 103 of semiconductor memory chip 100 are applied to replacement information addition load unit 203 of semiconductor memory chip 200. Data is set in replacement data retain unit 204, likewise the operation in semiconductor memory chip 100.

Figure 6:
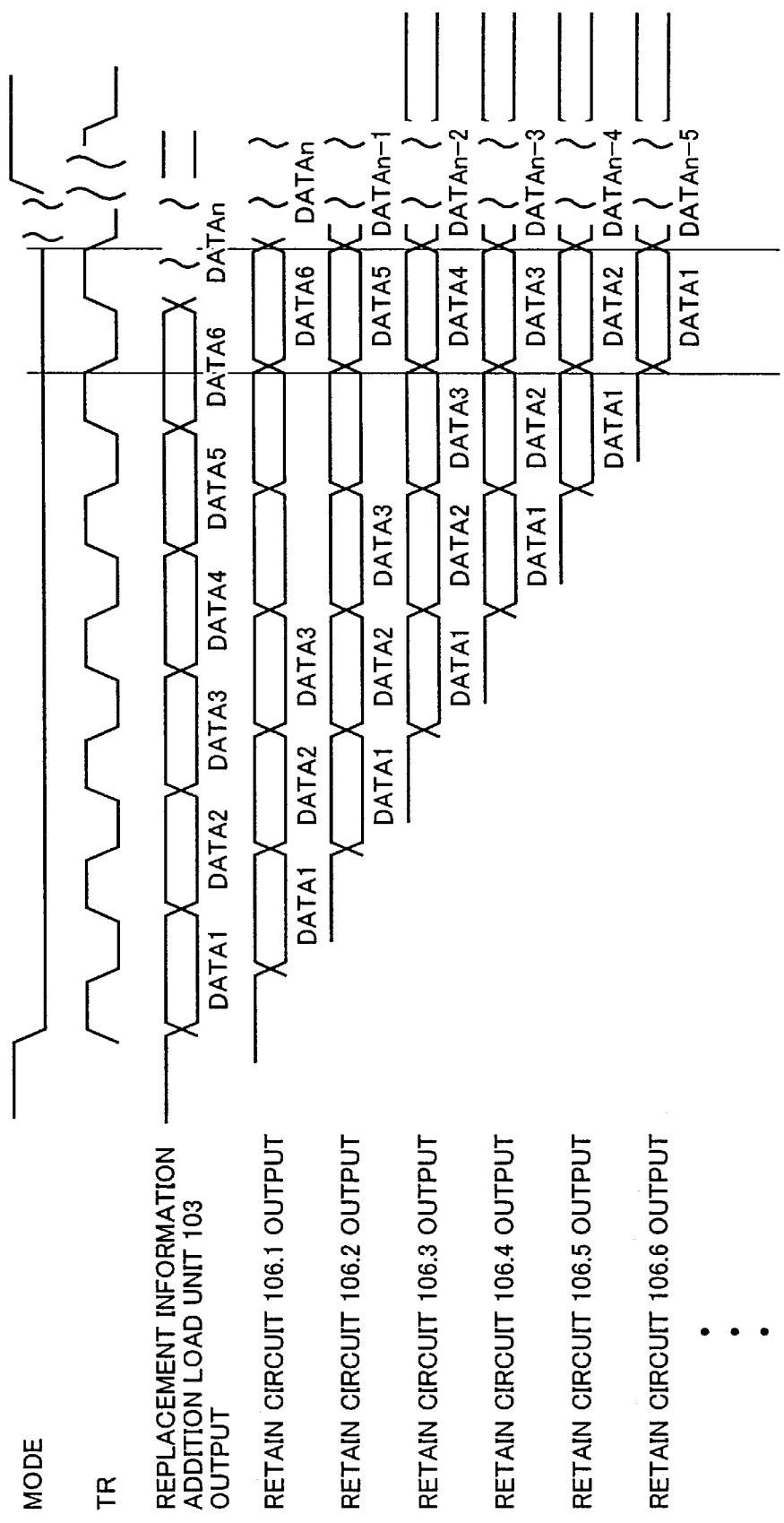
FIG. 6 is a timing chart of a mode signal MODE, a trigger signal TR, data output from a replacement information addition load unit 103, and data output from each of retain circuits 106.1–106.N.

FIG. 6 is a timing chart of mode signal MODE from replacement information control unit 20, trigger signal TR output from replacement information load unit 103, data output from replacement information addition load unit 103, and data output from each of retain circuits 106.1–106.N.

Data setting is completed by applying data to be set serially into each of retain circuits 1061.–106.N in replacement data retain unit 104.

By the above-described structure, memory cell defect detected after a plurality of types of or a plurality of semiconductor memory chips subjected to replacement-repair in the test for each individual chip are assembled into the same package can be repaired.

In other words, repair can be effected by carrying out replacement with an unused redundant cell in a semiconductor memory chip by means of a replacement information storage unit 10 provided in the package to store replacement information, or by adding replacement information to change the address corresponding to replacement for the redundant memory cell row and redundant memory cell column already used. It is therefore possible to repair a defect even after assembly to improve the yield of the multichip module.

Second Embodiment

Figure 7:
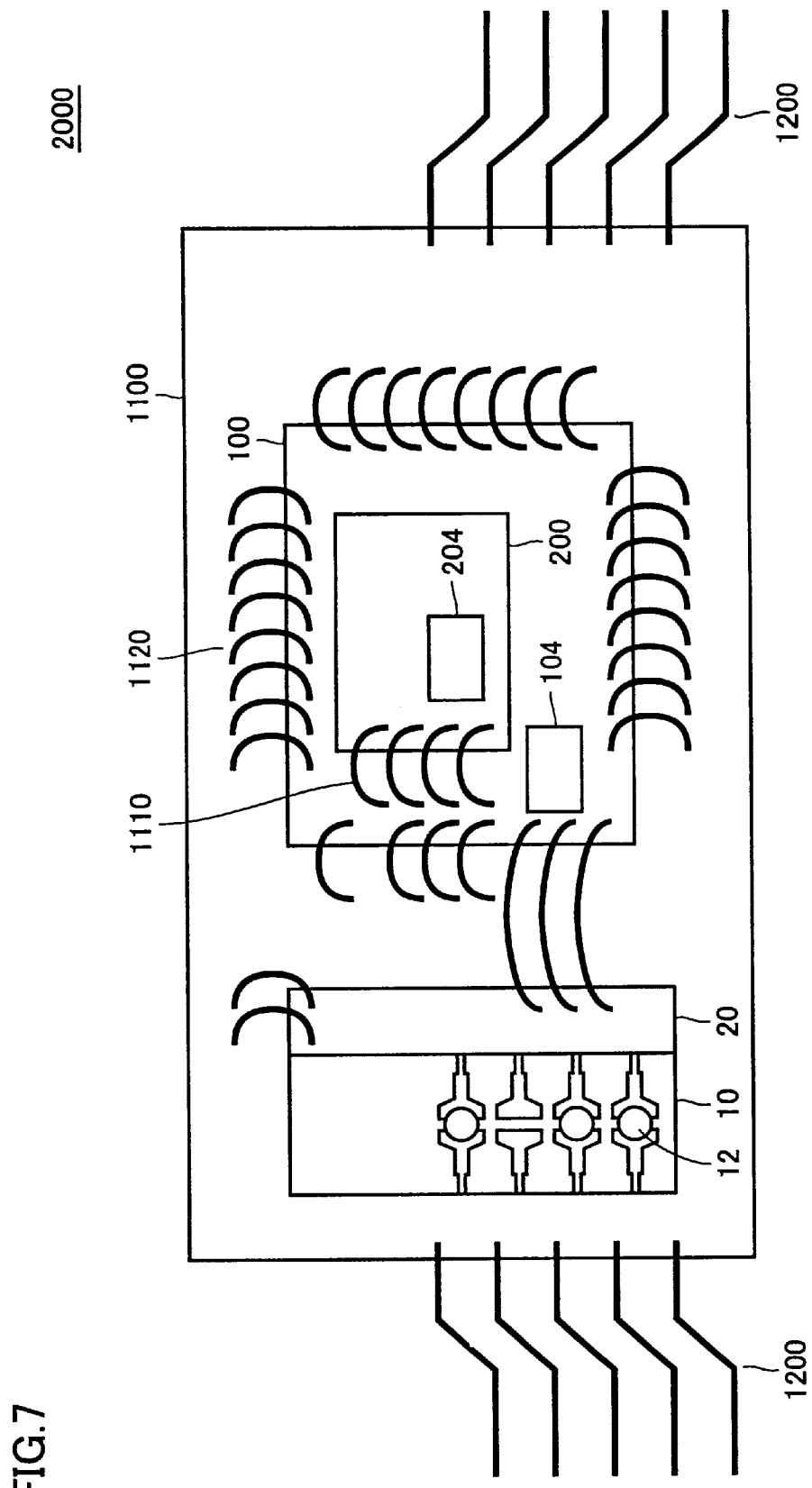
FIG. 7 is a schematic diagram of a structure of a multichip module 2000 according to a second embodiment of the present invention.

FIG. 7 is a schematic diagram of a structure of a multichip module 2000 according to a second embodiment of the present invention.

The structure of multichip module 2000 of the second embodiment differs from the structure of multichip module 1000 of the first embodiment in that replacement information storage unit 10 stores replacement information to be added based on the presence/absence of a bump instead of the presence/absence of wire bonding.

As shown in FIG. 7, replacement information storage unit 10 stores replacement information by two lines and a bump 12 that can selectively connect the two lines.

Figure 8:
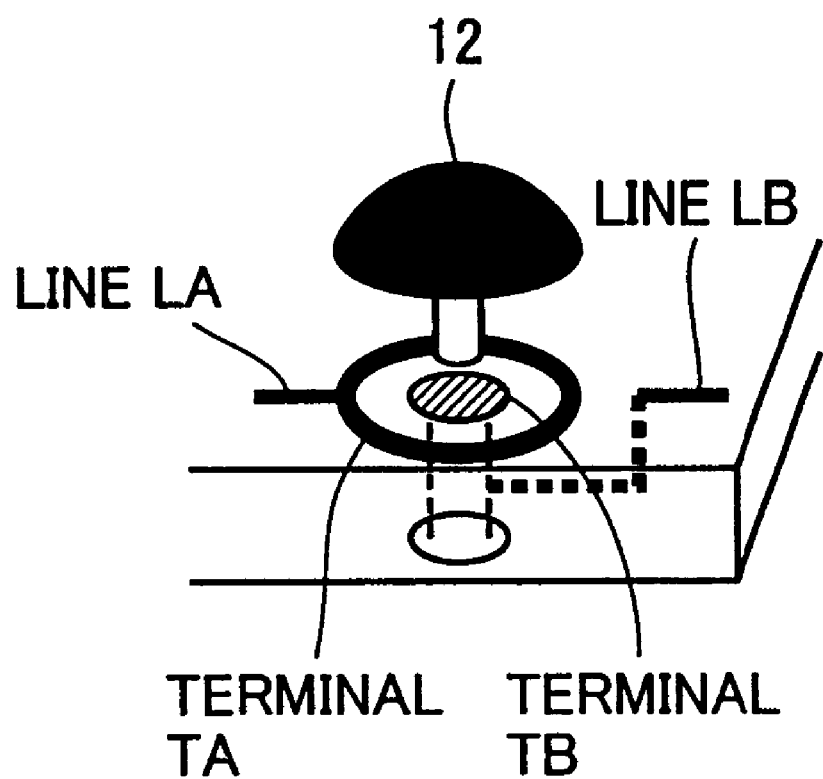
FIG. 8 shows a structure of information storage by a bump.

FIG. 8 shows a structure of information storage through such a bump.

Bonding bump 12 is provided with a circular terminal TA on the surface of the lead frame, a lead line LA extending from terminal TA, a terminal TB in a through hole formed through the lead frame at the center of circular terminal TA, and a lead line LB coupled to terminal TB in the lead frame. When a bonding bump is inserted in the through hole, lead lines LA and LB are coupled. Therefore, by using bump 12 instead of wire WR of FIG. 4, information of an L level, for example, can be stored.

Thus, replacement information can be stored by means of a bonding bump. This is advantageous in that information can be stored using less space than that by wire bonding. The possibility of connection failure due to wire cut off is eliminated, and the process of the bonding device per se is simplified. Therefore, the processing time at the bonding device can be reduced.

Third Embodiment

Figure 9:
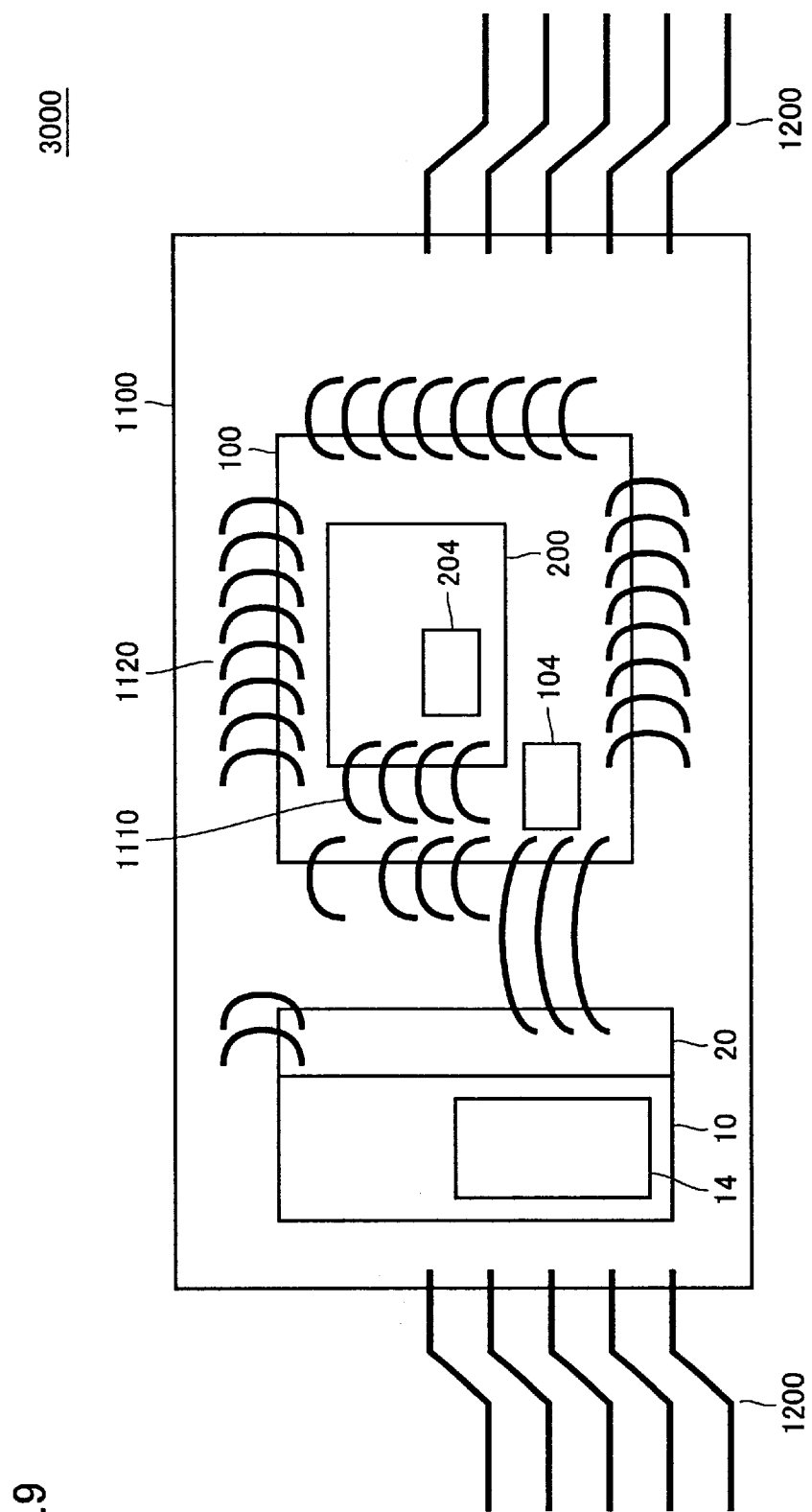
FIGS. 9, 10 and 11 are schematic diagrams of a multichip module 3000 according to a third embodiment, a multichip module 4000 according to a fourth embodiment, and a multichip module 5000 according to a fifth embodiment, respectively, of the present invention.

FIG. 9 is a schematic diagram of the structure of a multichip module 3000 according to a third embodiment of the present invention.

The structure of multichip module 3000 of the third embodiment differs from the structure of multichip module

1000 of the first embodiment in its replacement information storage unit 10. Replacement information storage unit 10 of multichip module 3000 stores additional information by means of a semiconductor nonvolatile memory, for example a flash memory 14, instead of storing additional replacement information by means of the presence/absence of a bonding wire.

The remaining elements are similar to those of multichip module 1000 of the first embodiment. Corresponding components have the same reference characters allotted, and description thereof will not be repeated.

The above structure is advantageous in that less area is required by using in common the memory cell of a semiconductor nonvolatile memory such as a flash memory, when provided as one of a plurality of types of memory chips stacked in the package.

There is also an advantage that replacement information can be stored and modified arbitrarily through an externally applied input from a semiconductor tester device currently available via lead 1200 since the additional replacement information is stored through a semiconductor nonvolatile memory such as a flash memory. Thus, the additional replacement information can be written after sealing of the package has been completed.

Fourth Embodiment

Figure 10:
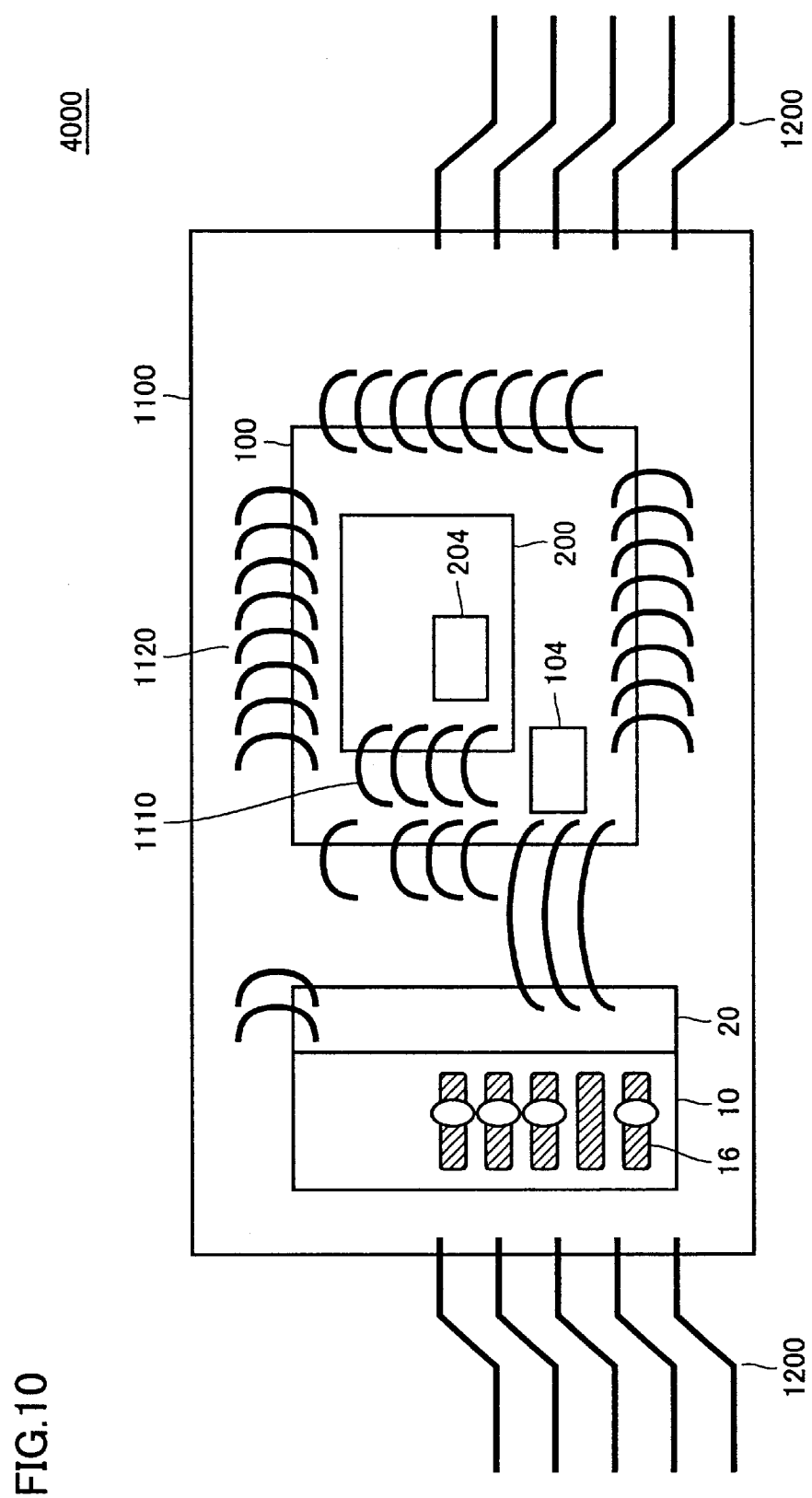

FIG. 10 is a schematic diagram of a structure of a multichip module 4000 according to a fourth embodiment of the present invention.

The structure of multichip module 4000 of the fourth embodiment differs from the structure of multichip module 1000 of the first embodiment in that replacement information storage unit 10 stores additional replacement information by means of an electrical fuse element 16 that is fused or burned out by applying excessive voltage from an external source instead of storing additional replacement information by means of the presence/absence of wire bonding.

The remaining elements are similar to those of multichip module 1000 of the first embodiment. Corresponding components have the same reference characters allotted, and description thereof will not be repeated.

By using an electric fuse element 16 instead of wire WR of FIG. 4, information of an L level or an H level can be stored.

By such a structure, additional replacement information can be stored through an externally applied voltage. Therefore, additional replacement information can be programmed by an electric signal applied via lead 1200 using the function of a conventional semiconductor tester device. Thus, the additional replacement information can be programmed after sealing of the package is completed.

Fifth Embodiment

Figure 11:
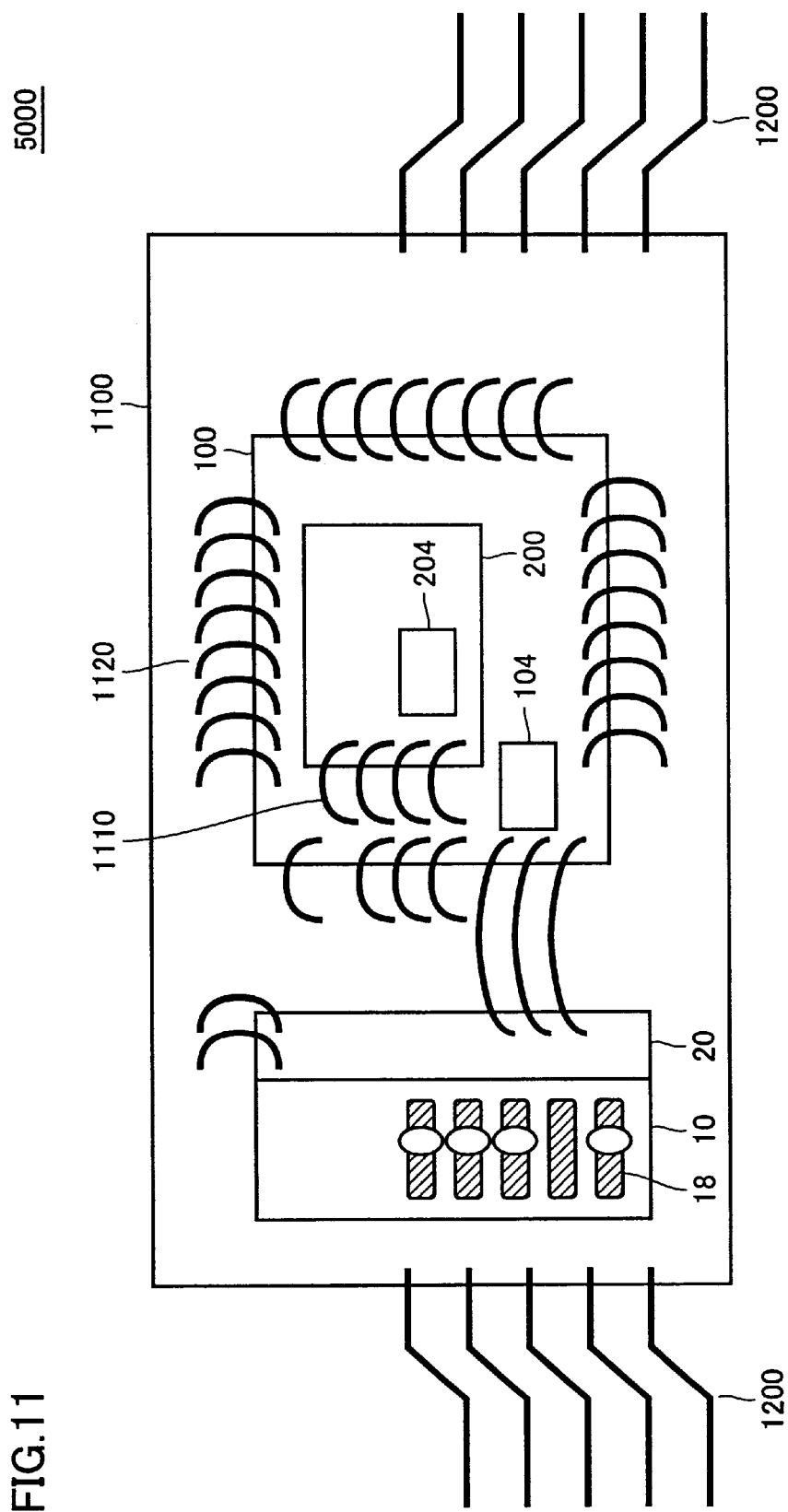

FIG. 11 is a schematic diagram of a structure of a multichip module 5000 according to a fifth embodiment of the present invention.

The stricture of multichip module 5000 of the fifth embodiment differs from the structure of multichip module 1000 of the first embodiment in that replacement information storage unit 10 stores additional information through an LT fuse element 18 that can be laser-trimmed instead of through the absence/presence of wire bonding.

The remaining elements are similar to those of multichip module 1000 of the first embodiment. Corresponding components have the same reference characters allotted, and description thereof will not be repeated.

By using fuse element 18 instead of wire WR of FIG. 4, information of an L level or an H level can be stored.

Figure 12:
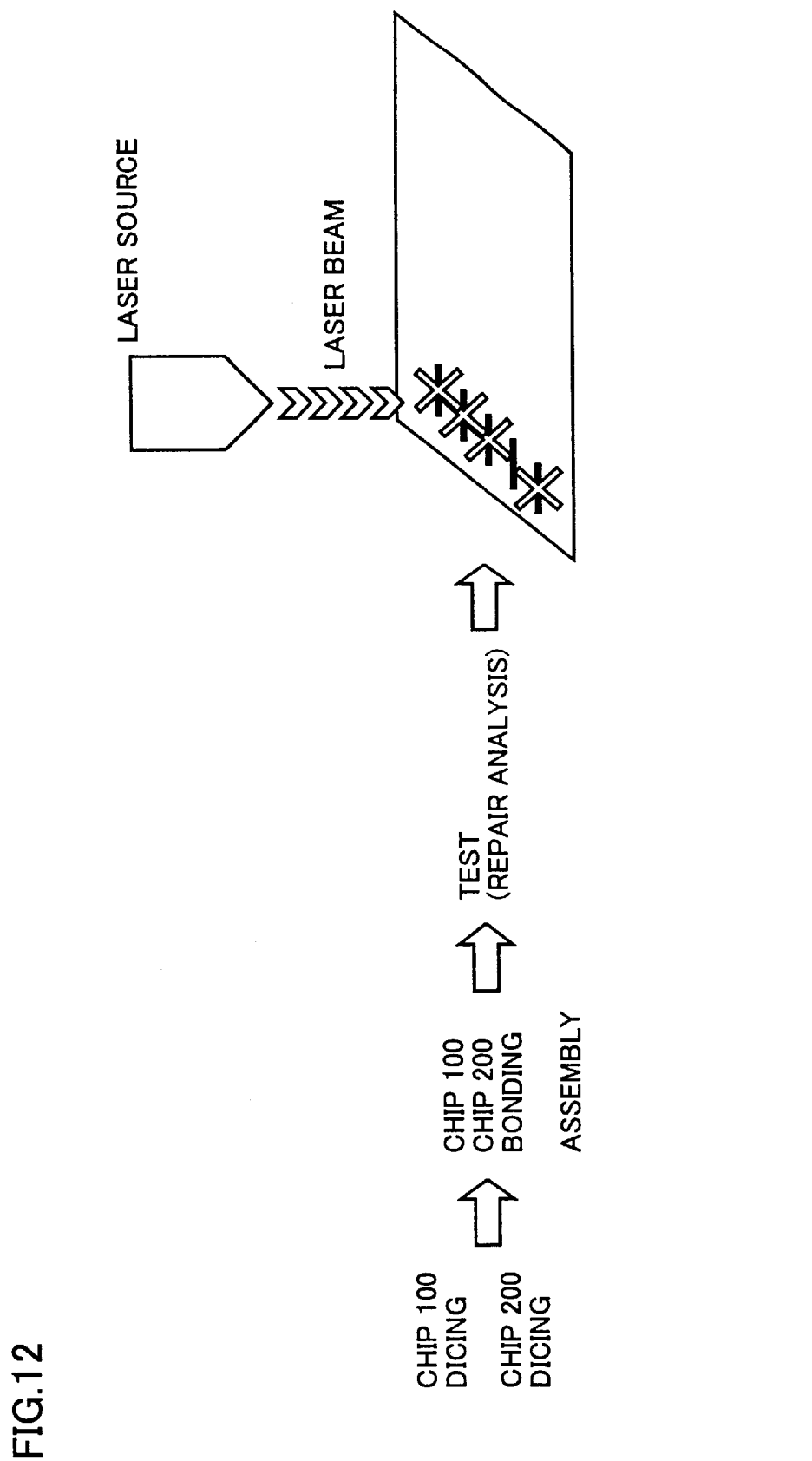
FIG. 12 is a flow chart of a production process of the fifth embodiment.

FIG. 12 is a flow chart of the production process according to the fifth embodiment of the present invention.

First, chips 100 and 200 already tested individually to be subjected to redundancy repair processing are separated by dicing.

Then, chips 100 and 200 are bonded and assembled.

After the assembly, testing is effected to analyze redundancy replacement repair.

Based on the analyzed result, the fuse element in replacement information storage unit 10 is trimmed by a laser beam.

Figure 13:
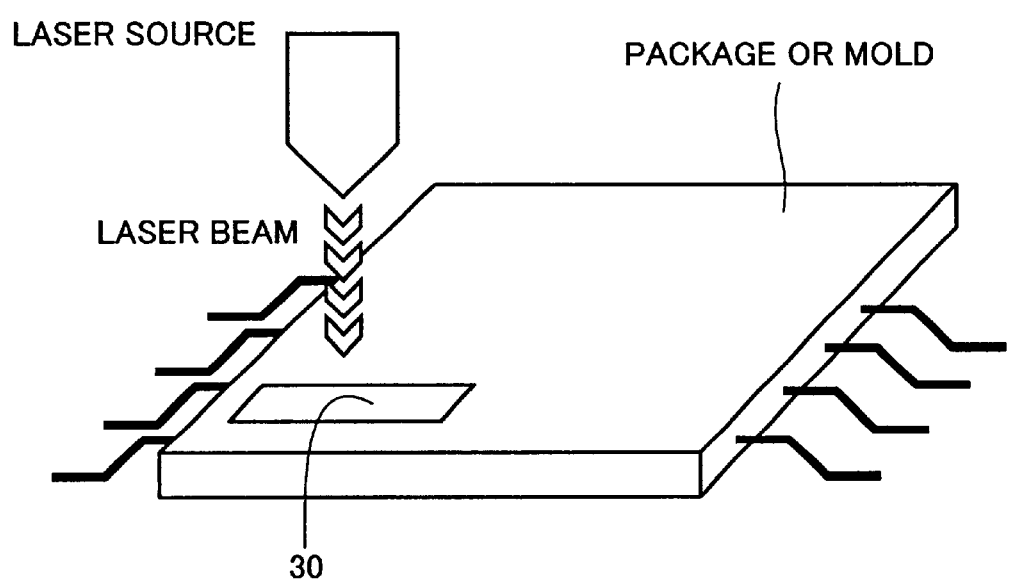
FIG. 13 is a schematic diagram of multichip module 5000 sealed in a package or mold.

FIG. 13 is a schematic diagram of multichip module 5000 of FIG. 11 sealed in a package or a mold.

In the present specification, the term "package" implies a container or member to store a plurality of semiconductor memory chips, and represents the concept including "mold", "ceramic package", and the like.

Referring to FIG. 13, a window 30 for laser trimming is provided in the package (mold) so that the fuse element in replacement information storage unit 10 can be trimmed through a laser beam.

By laser-trimming fuse element 18 on the package frame according to the above structure, a defect found after assembly can be repaired through laser cutting without the semiconductor memory chip being subjected to the damage by the laser energy.

Since the semiconductor memory chip will not be irradiated with the laser beam, it is no longer necessary to carry out the complicated evaluation of energy adjustment and damage evaluation taking into account the damage to the semiconductor memory chip. Furthermore, the additional replacement information can be programmed after sealing of the package has been completed.

Sixth Embodiment

Figure 14:
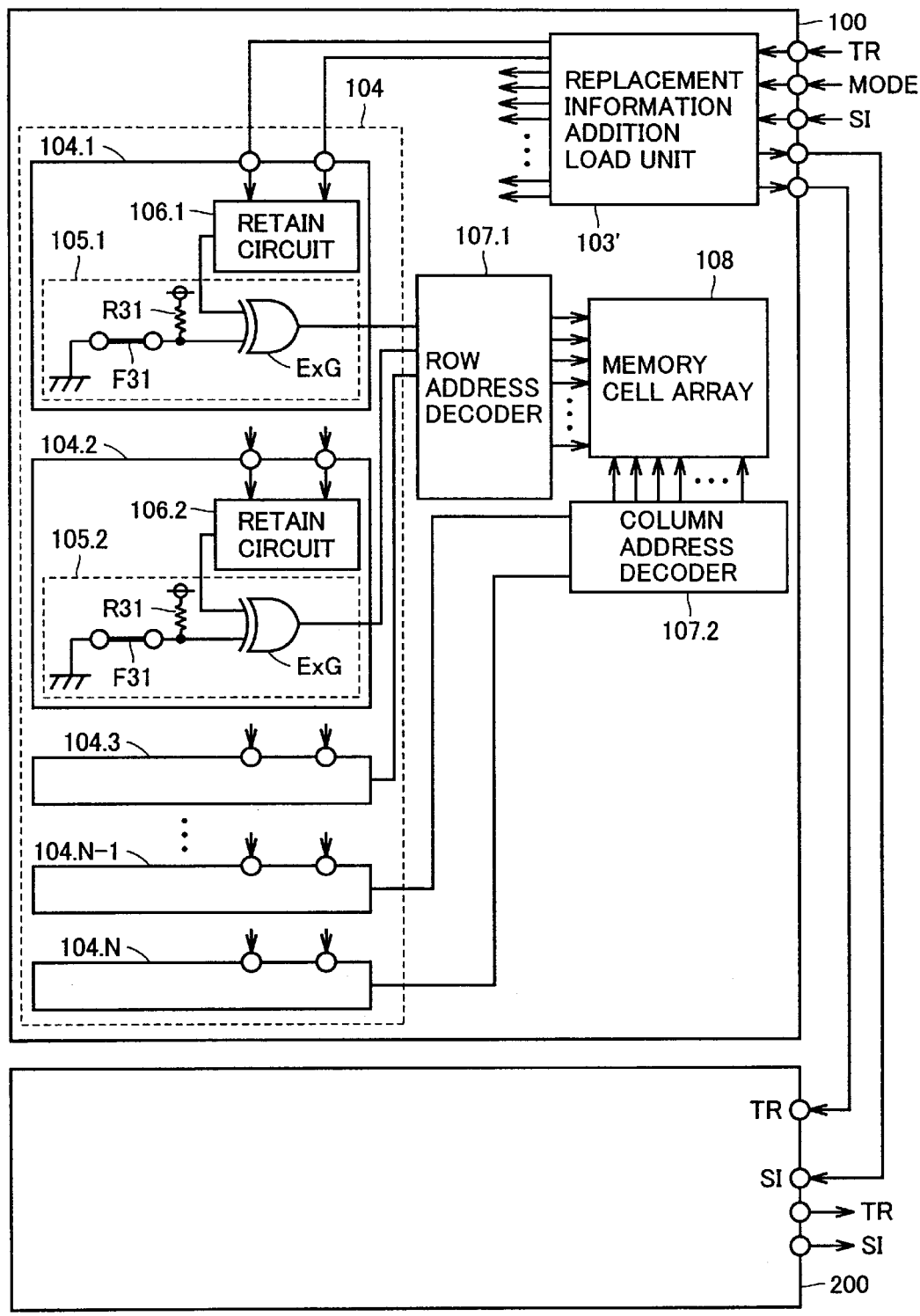
FIG. 14 is a schematic block diagram of a structure of semiconductor memory chips 100 and 200 in a multichip module according to a sixth embodiment of the present invention.

FIG. 14 is a schematic block diagram of the structure of semiconductor memory chips 100 and 200 in a multichip module according to a sixth embodiment of the present invention.

The sixth embodiment is similar to the first embodiment of FIG. 5 in that the bit train of the replacement information read out from replacement information storage unit 10 is transmitted serially to a replacement information addition load unit 103' in memory chip 100 by replacement storage control unit 20.

Replacement information addition load unit 103' sends two data of an H or L level in parallel to each of partial data retain units 104.1–104.N provided corresponding to respective fuse elements F31 in replacement data retain unit 104, and effects data storage to retain circuits 106.1–106.N by a trigger signal TR.

Data stored in retain circuits 106.1–106.N in replacement data retain unit 104 is applied to one input of exclusive OR gate circuit ExG, whereby exclusive OR gate circuit ExG transmits to row address decoder 107.1 or column address decoder 107.2 the value set by fuse element F31 directly or in an inverted manner. By altering the replacement information set by fuse element F31 through additional replacement information applied subsequently, a defective bit in the memory generated after assembly can be additionally replaced with a redundant replacement cell.

Since data is set simultaneously in parallel to retain circuits 106.1–106N, the concurrent setting of data can be effected by just one trigger. There is an advantage that the time required for setting can be reduced.

Seventh Embodiment

Figure 15:
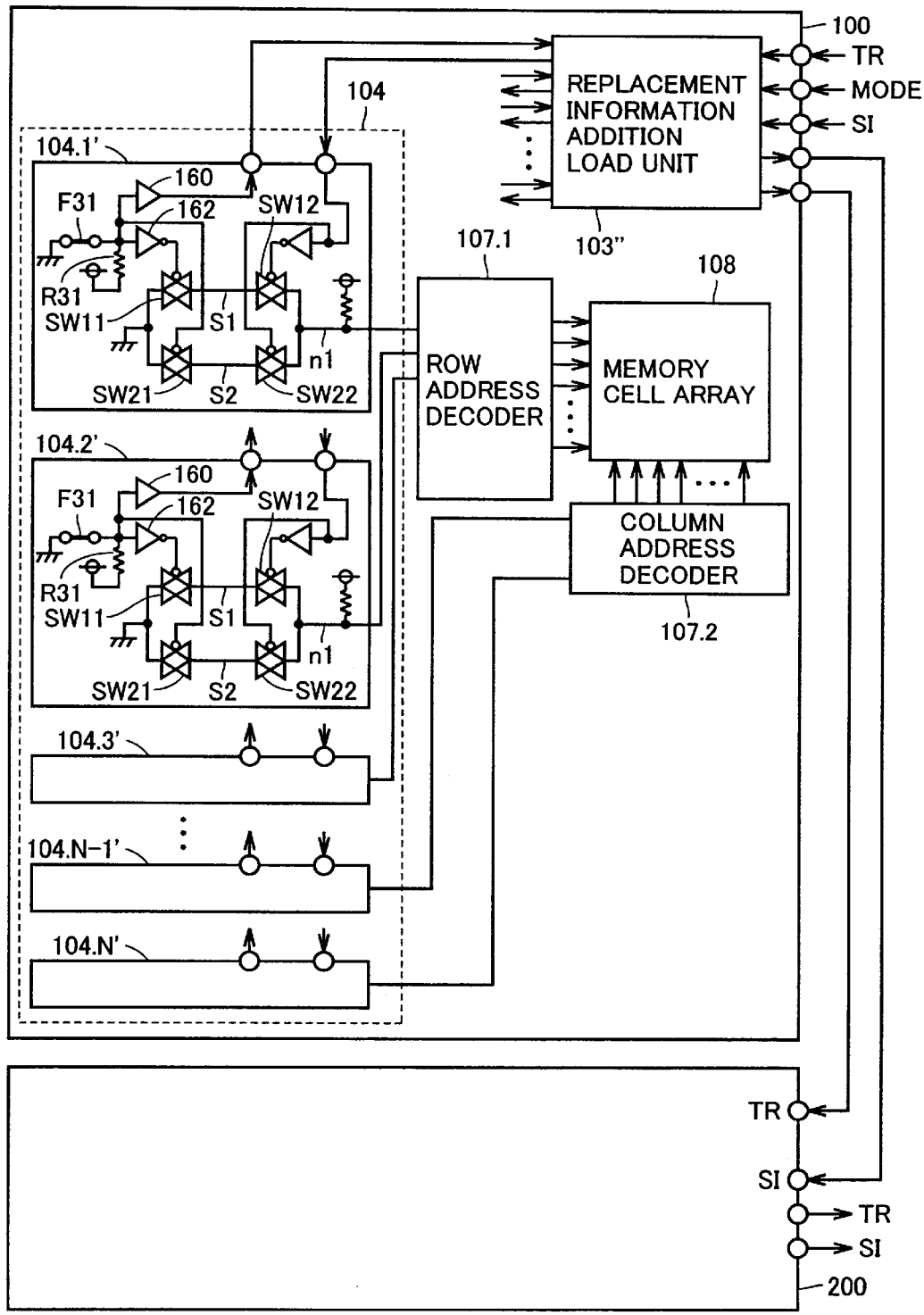
FIG. 15 is a schematic block diagram showing a structure of semiconductor memory chips 100 and 200 in a multichip module according to a seventh embodiment of the present invention.

FIG. 15 is a schematic block diagram of the structure of semiconductor memory chips 100 and 200 in a multichip module according to a seventh embodiment of the present invention.

The operation of storing additional replacement information data in the semiconductor memory chip of the seventh embodiment will be described with reference to FIG. 15.

Following power on or in response to input of an arbitrary command, replacement storage control unit 20 sequentially reads out the bit train of additional replacement information stored by means of the presence/absence of wire bonding, presence/absence of bonding bump, burn out/fusing of the flash memory cell or interconnection fuse, applied from replacement information storage unit 10.

The bit train of the replacement information read out from replacement information storage unit 10 is transmitted serially to a replacement information addition load unit 103" in semiconductor memory chip 100 by replacement storage control unit 20.

Replacement information addition load unit 103" can invert the replacement information set by fuse element F31 by sending in parallel data of an H or L level to partial data retain units 101.1'–104.N' in replacement data retain unit 104. Accordingly, the replacement information by fuse element F31 is changed.

The set value stored by the set of fuse element F31 and high resistive element R31 is a kind of flag indicating the state of the result of fuse element F31. Replacement information addition load unit 103" receives the value of that flag via driver circuit 160.

Replacement information addition load unit 103" alters the value to be input to respective partial data retain units 104.1'–104.N' according to the flag value and the bit train of replacement information read out from replacement information storage unit 10, whereby the intended replacement information is output from replacement data retain unit 104. Accordingly, additional replacement of a defective bit generated after the assembly with a redundant replacement cell is effected.

It is assumed that data of an L level is initially applied from replacement information addition load unit 103" to partial data retain units 104.1'–104.N'.

For example, when fuse element F31 is not cut in partial data retain unit 104.1, the data stored according to fuse element F31 and resistive element R31 is at an L level. Accordingly, an electric switch SW21 at the line of the S2 side in FIG. 15 is turned on. An electric switch SW22 is also ON. Therefore, an output node n1 of partial data retain unit 104.1 is connected to ground.

In order to invert the replacement information in partial data retain unit 104.1, replacement information addition load unit 103" sets the input to partial data retain unit 104.1 applied with the initial input of an L level to an H level. In response, an electric switch SW12 at the S1 side is turned on whereas electric switch SW22 at the S2 side is turned off. Accordingly, the level of node n1 attains an H level since switch SW11 at the S1 side is off. By such a series of operation, the replacement information can be altered to carry out replacement after assembly.

In the case where fuse element F31 is cut, the value stored according to fuse element F31 and resistive element 31 attains an H level. In contrary to the above-described operation, electric switch SW11 at the S1 side is turned on, whereby the line at the S1 side is connected to ground. Since an input of an L level is normally applied to fuse element F31 so that electric switch SW22 at the S2 side is on, an H level is output initially as the replacement information.

However by altering the input to partial data retain unit 104.1 with an L input to an H level, electric switch SW12 at the S1 side is turned on, and output node n1 is connected to ground. Accordingly, replacement information of an L level is output. Thus, the replacement information is altered to carry out replacement after assembly.

The seventh embodiment is advantageous in that the circuit configuration can be simplified since the replacement data storing function can be configured by the electric switch and wiring.

Eighth Embodiment

Figure 16:
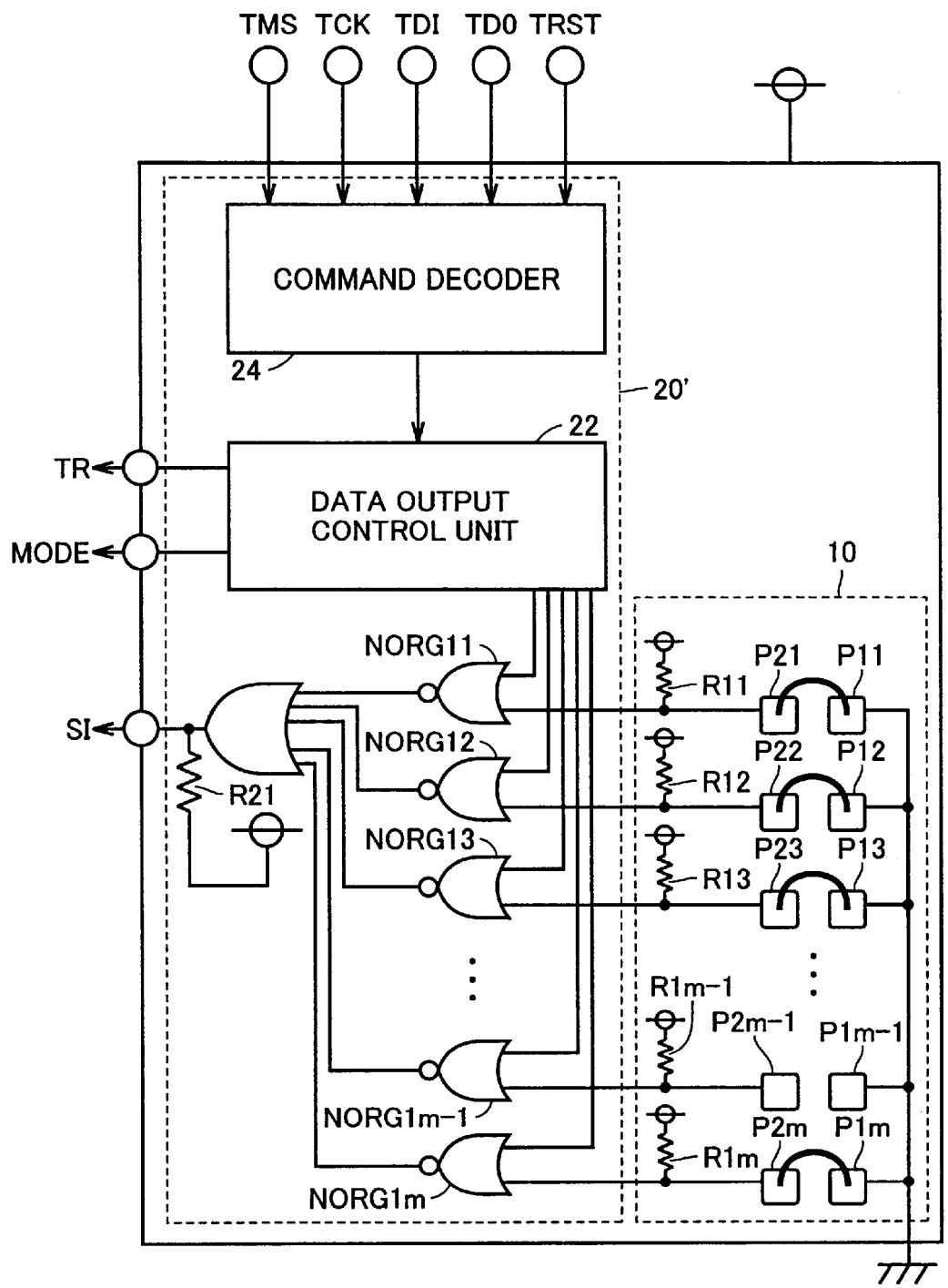
FIG. 16 is a schematic block diagram to describe a structure of a replacement storage control unit 20' according to an eighth embodiment of the present invention.

FIG. 16 is a schematic block diagram to describe a structure of a replacement storage control unit 20' according to the eighth embodiment of the present invention.

In the previous first embodiment, replacement storage control unit 20 is actuated to effect setting at the time of power on.

In the eighth embodiment, actuation execution is implemented by issuing a command through a control circuit compliant with JTAG (Joint Test Action Group) which is a standard test access port that provides control with five signals. Specifically, replacement information control unit 20' further includes a command decoder 24 receiving control signals TMS, TCK, TDI, TDO and TRST based on the JTAG to control data output control unit 22 according to the received commands.

The remaining structure is similar to that of the first embodiment. Corresponding components have the same reference characters allotted, and description thereof will not be repeated.

By the above structure, execution actuation can be implemented by an arbitrary specified time from a system that employs a multichip module. There is an advantage that the entire system can be controlled avoiding the problem arising from the operational timing with another semiconductor device.

The structure of replacement storage control unit 20' can be used in the first embodiment and other embodiments instead of replacement storage control unit 20.

The above description is based on a structure in which a plurality of semiconductor memory chips of different types are sealed within one package. The present invention is not limited to such a case, and is applicable to the case where a plurality of semiconductor memory chips of the same type are sealed in one package. Furthermore, the present invention is applicable to the case where a plurality of semiconductor memory chips and a semiconductor logic circuit chip are sealed within one package, provided that each chip has a redundant replacement function.

Furthermore, the memory circuit separated into chips and assembled to be mounted in one package is not limited to a semiconductor memory chip as long as it has a redundancy replacement function.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a package;

a hold member provided in said package;

a plurality of memory chips held at said hold member, each said memory chip including
a plurality of proper memory cells,
a spare memory cell,
a first storage circuit to store address information corresponding to a defective memory cell found during a fabrication process of said memory chip,
an information replacement circuit that can alter said address information output from said first storage circuit according to externally applied additional replacement information,
a replacement information input circuit to receive said additional replacement information from outside said memory chip, and
a select circuit selecting any of said proper memory cell and said spare memory cell according to an output from said information replacement circuit and an address signal;

a coupling member to transfer a signal between said plurality of memory chips;

a replacement information storage circuit provided on set hold member to store said additional replacement information determined according to testing carried out on said plurality of memory chips after at least said plurality of memory chips and said coupling member are formed on said hold member; and a replacement storage control circuit provided on said hold member to apply said additional replacement information stored in said replacement information storage circuit to said replacement information input circuit of said plurality of memory chips.

2. The semiconductor device according to claim 1, wherein said replacement information storage circuit comprises
a plurality of wiring pairs each capable of being coupled by wire bonding, and
a conversion circuit to convert a status of whether said plurality of wiring pairs are coupled by wiring or not into said additional replacement information.

3. The semiconductor device according to claim 1, wherein said replacement information storage circuit comprises
a plurality of wiring pairs each capable of being bonded by a bump, and
a conversion circuit to convert a status of whether said plurality of wiring pairs are coupled by said bump or not into said additional replacement information.

4. The semiconductor device according to claim 1, wherein said replacement information storage circuit comprises a nonvolatile semiconductor memory to stored said additional replacement information.

5. The semiconductor device according to claim 1, wherein said replacement information storage circuit comprises
a plurality of wiring pairs,
a plurality of fuse elements that can alter a coupling status of said plurality of wiring pairs according to an externally applied electric signal, and
a conversion circuit to convert a status of whether said plurality of wiring pairs are coupled or not into said additional replacement information.

6. The semiconductor device according to claim 1, wherein said replacement information storage circuit comprises
a plurality of wiring pairs,
a plurality of fuse elements that can alter a coupling status of said plurality of wiring pairs according to an externally applied light radiation, and
a conversion circuit to convert a status of whether said plurality of wiring pairs are coupled or not into said additional replacement information.

7. The semiconductor device according to claim 6, wherein said package includes a window for said light radiation.

8. The semiconductor device according to claim 1, wherein said replacement information input circuit of said plurality of memory chips is connected to each other serially,
wherein said replacement storage control circuit transmits said additional replacement information serially to a plurality of said replacement information input circuits.

9. The semiconductor device according to claim 8, wherein each said memory chip comprises a second storage circuit to store said additional replacement information transmitted serially,
wherein said information replacement circuit comprises a logic operation circuit to receive outputs from said first and second storage circuits to carry out exclusive OR operation.

10. The semiconductor device according to claim 8, wherein said replacement storage control circuit transmits in parallel said additional replacement information to a plurality of said replacement information input circuits,
wherein each said memory chip comprises a second storage circuit to store said transmitted additional replacement information,
wherein said information replacement circuit comprises a logic operation circuit to receive outputs from said first and second storage circuits to carry out exclusive OR operation.

11. The semiconductor device according to claim 1, wherein said information replacement circuit comprises
an output node,
a first switch circuit coupling said output node with a predetermined potential according to an output from said first storage circuit, and
a second switch circuit provided between said output node and said first switch circuit, coupling said output node with said first switch circuit according to said additional replacement information.

12. The semiconductor device according to claim 1, wherein said first storage circuit includes a fuse element to record said additional replacement information.

13. The semiconductor device according to claim 1, wherein said replacement storage control circuit comprises a command decode circuit to control an operation according to a command signal compliant to JTAG.

* * * * *